(12) United States Patent
Kosai et al.

(10) Patent No.: US 12,300,518 B2
(45) Date of Patent: May 13, 2025

(54) SUBSTRATE PROCESSING APPARATUS AND SUBSTRATE PROCESSING METHOD HAVING ENHANCED CONFIGURATION OF REPLENISHING PROCESSING LIQUID

(71) Applicant: Tokyo Electron Limited, Tokyo (JP)

(72) Inventors: Kazuki Kosai, Koshi (JP); Hideaki Udou, Koshi (JP); Seiya Fujimoto, Koshi (JP); Yudai Takanaga, Koshi (JP); Takahito Nakashoya, Koshi (JP); Shogo Fukui, Koshi (JP); Atsushi Anamoto, Koshi (JP); So Osada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 345 days.

(21) Appl. No.: 17/808,160

(22) Filed: Jun. 22, 2022

(65) Prior Publication Data

US 2023/0005763 A1 Jan. 5, 2023

(30) Foreign Application Priority Data

Jun. 30, 2021 (JP) ................................. 2021-108852
Oct. 26, 2021 (JP) ................................. 2021-174421

(51) Int. Cl.
*H01L 21/67* (2006.01)
*B08B 13/00* (2006.01)

(52) U.S. Cl.
CPC ........ *H01L 21/67051* (2013.01); *B08B 13/00* (2013.01); *H01L 21/67023* (2013.01); *B08B 2203/027* (2013.01)

(58) Field of Classification Search
CPC ......... H01L 21/67023; H01L 21/67276; Y02P 90/02; G05D 9/12
See application file for complete search history.

(56) References Cited

U.S. PATENT DOCUMENTS 10,500,617 B2 * 12/2019 Mizota .............. H01L 21/67051
10,861,717 B2 * 12/2020 Iwao ................. H01L 21/67051
11,626,298 B2 * 4/2023 Takamatsu ........ H01L 21/67051
                                                        134/18

FOREIGN PATENT DOCUMENTS

JP        2007266442 A  * 10/2007
JP        2012028807 A  *  2/2012
(Continued)

OTHER PUBLICATIONS

Translation KR 20190115416.*
Translation of JP 2012028807.*
Translation of JP 2007266442.*

*Primary Examiner* — Kevin F Murphy
(74) *Attorney, Agent, or Firm* — Armstrong Teasdale LLP

(57) ABSTRACT

An apparatus includes: a tank storing a processing liquid; a circulation line; a branch line; a processing part for supplying the processing liquid to a substrate at the branch line; a discharge part for reducing a storage amount of the processing liquid; a supply part for supplying a new processing liquid to the tank; and a controller including: a first determination part for determining whether the storage amount is less than a lower limit value; a first replenishment controller for replenishing the processing liquid to the tank when the storage amount is less than the lower limit value; a calculation part for calculating a replenishment amount of the processing liquid; and a second replenishment controller for reducing the storage amount and replenishing the processing liquid to the tank when a calculation value of the replenishment amount is less than a set value.

8 Claims, 15 Drawing Sheets

(56) References Cited

FOREIGN PATENT DOCUMENTS

JP 2018-181881 A 11/2018
KR 20190115416 A * 10/2019

* cited by examiner

SUBSTRATE PROCESSING APPARATUS AND SUBSTRATE PROCESSING METHOD HAVING ENHANCED CONFIGURATION OF REPLENISHING PROCESSING LIQUID

CROSS-REFERENCE TO RELATED APPLICATIONS

This application is based upon and claims the benefit of priority from Japanese Patent Application No. 2021-108852, filed on Jun. 30, 2021, and Japanese Patent Application No. 2021-174421, filed on Oct. 26, 2021, the entire contents of which are incorporated herein by reference.

TECHNICAL FIELD

The present disclosure relates to a substrate processing apparatus and a substrate processing method.

BACKGROUND

The substrate processing system disclosed in Patent Document 1 includes one or more processing units, a storage part, a liquid storage part, an acquisition part, a setting part, a detection part, a recognition part, and a sensing part. One or more processing units process a substrate with a processing liquid. The storage part stores processing plan information indicating execution timing for a plurality of continuous processes related to a plurality of substrate groups in the one or more processing units. The liquid storage part stores the processing liquid. The acquisition part acquires a numerical value related to the state of the processing liquid. The setting part sets an exchange time of the processing liquid in the liquid storage part based on the numerical value acquired by the acquisition part and a rule relating to the life of the processing liquid. The sensing part senses a standby state in which the continuous processes are not executed in the one or more processing units at the time of exchange. The recognition part recognizes the duration of the standby state based on the processing plan information. The detection part detects a liquid replaceable state in which the duration is equal to or longer than a preset reference time.

PRIOR ART DOCUMENT

Patent Document

Patent Document 1: Japanese Laid-Open Patent Publication No. 2018-181881

SUMMARY

According to one embodiment of the present disclosure, there is provided a substrate processing apparatus includes: a tank that stores a processing liquid; a circulation line configured to remove the processing liquid from the tank and return the processing liquid to the tank; a branch line branching from the circulation line; a processing part configured to supply the processing liquid to a substrate at an end of the branch line; a discharge part configured to reduce a storage amount of the processing liquid stored in the tank; a supply part configured to supply a new processing liquid to the tank; and a controller configured to control the processing part, the discharging part, and the supply part, wherein the controller includes: a first determination part configured to determine whether or not the storage amount of the processing liquid stored in the tank is less than a lower limit value; a first replenishment controller configured to replenish the processing liquid to the tank by the supply part when the first determination part determines that the storage amount is less than the lower limit value; a calculation part configured to calculate a replenishment amount of the processing liquid to be replenished to the tank per set time by the supply part; and a second replenishment controller configured to reduce the storage amount of the tank by the discharge part and replenish the processing liquid to the tank by the supply part when a calculation value of the replenishment amount calculated by the calculation part is less than a set value.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
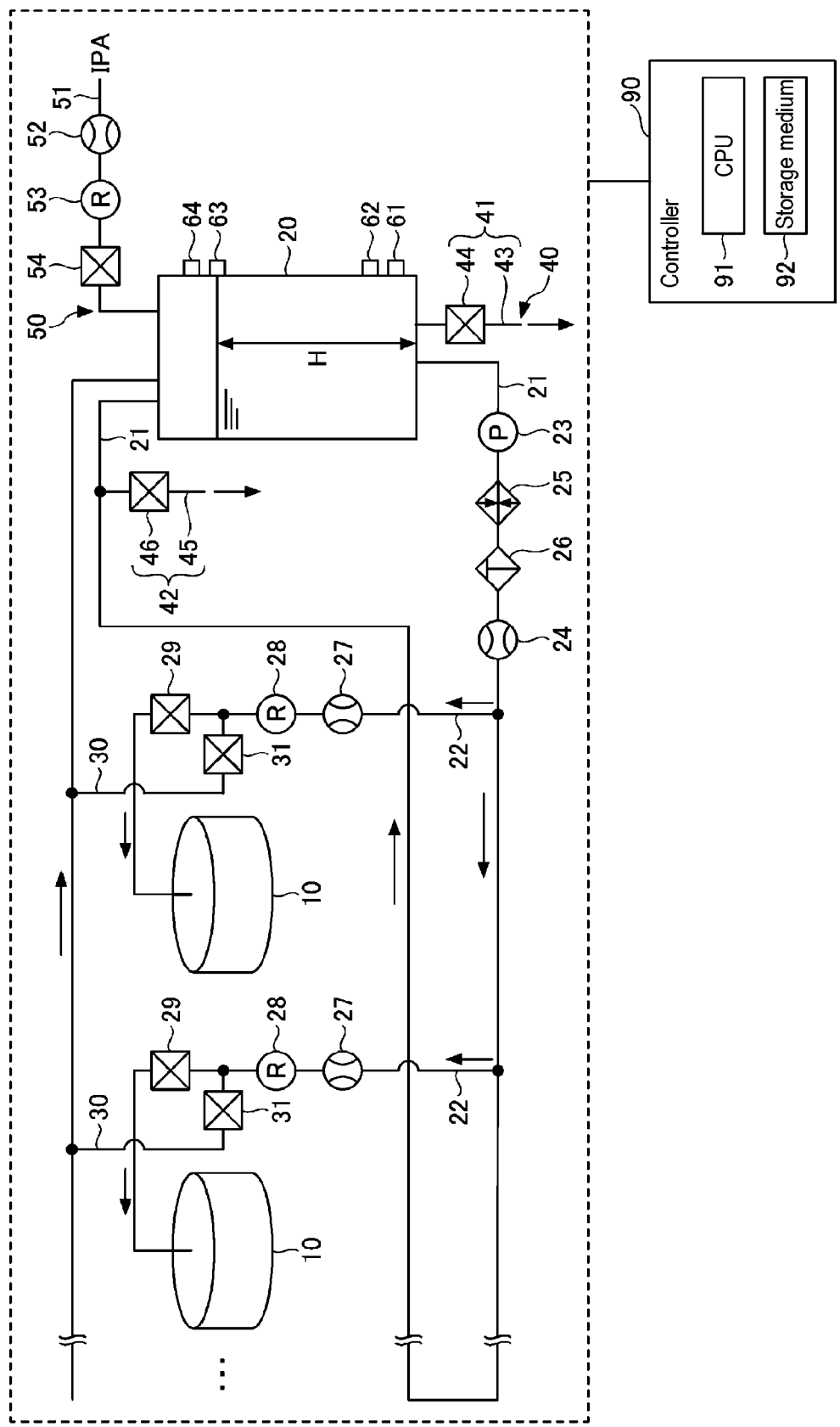
FIG. 1 is a view illustrating a substrate processing apparatus according to an embodiment.

Hereinafter, embodiments of the present disclosure will be described with reference to the drawings. In each drawing, the same or corresponding components may be denoted by the same reference numerals, and a description thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A substrate processing apparatus 1 according to the present embodiment will be described with reference to FIG. 1. The substrate processing apparatus 1 includes a processing part 10. The processing part 10 processes a substrate by supplying a processing liquid to the substrate. In the present embodiment, the processing part 10 is of a single-wafer type that processes substrates one by one.

The processing part 10 may be a batch type that processes a plurality of substrates at the same time. The batch type processing part 10 includes a processing tank, and the substrates are immersed in the processing liquid stored in a processing tank. In this case, the substrates W may be immersed in the processing liquid in a vertically standing state.

Figure 2:
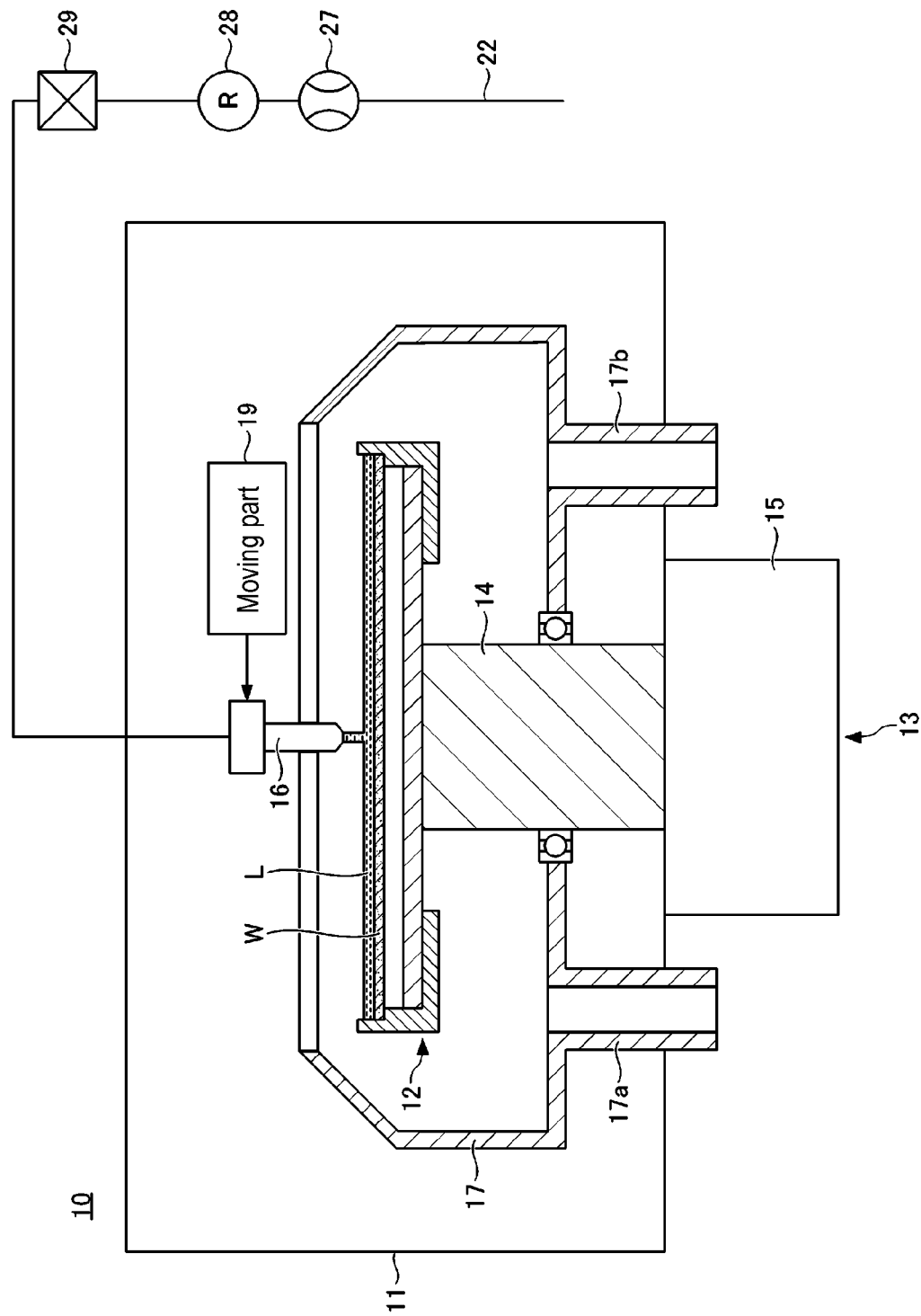
FIG. 2 is a view illustrating an example of a processing part.

As illustrated in FIG. 2, the single-wafer type processing part 10 includes, for example, a processing container 11, a holder 12 configured to hold the substrate W horizontally, a rotation part 13 configured to rotate the holder 12 around a vertical rotation shaft 14, and a nozzle 16 configured to eject liquid on the top surface of the substrate W held by holder 12.

The processing container 11 accommodates the substrate W therein. The processing container 11 includes a gate (not illustrated) and a gate valve (not illustrated) configured to open/close the gate. The substrate W is carried into the processing container 11 through the gate, processed with a processing liquid L inside the processing container 11, and then carried out to the exterior of the processing container 11 through the gate.

The holder 12 horizontally holds the substrate W carried into the processing container 11. The holder 12 holds the substrate W horizontally such that the surface of the substrate W on which a polysilicon film is formed is oriented upward and the center of the substrate W coincides with the rotation center line of the rotation shaft 14. The holder 12 is a mechanical chuck in FIG. 2, but may be a vacuum chuck, an electrostatic chuck, or the like. The holder 12 may be a rotatable spin chuck.

The rotation part 13 includes, for example, a vertical rotation shaft 14 and a rotation motor 15 configured to rotate the rotation shaft 14. The rotational driving force of the rotation motor 15 may be transmitted to the rotation shaft 14 via a rotation transmission mechanism, such as a timing belt or a gear. When the rotation shaft 14 is rotated, the holder 12 is also rotated.

The nozzle 16 includes an ejection port configured to eject the processing liquid L to the substrate W held by the holder 12. The nozzle 16 is disposed above the substrate W such that the ejection port is directed downward, and supplies the processing liquid L to the center of the substrate W. The processing liquid L is supplied to the central portion of the rotating substrate W and wet-spreads over the entire top surface of the substrate W by a centrifugal force to form a liquid film. The processing part 10 may include a moving part 19 configured to move the nozzle 16. The moving part 19 may move the nozzle 16 in the radial direction of the substrate W, or may move the nozzle 16 in the vertical direction.

The processing liquid L includes, for example, a chemical liquid, a rinsing liquid, and a drying liquid. One nozzle 16 may sequentially eject a plurality of processing liquids L, or a plurality of nozzles 16 may sequentially eject different processing liquids L. A plurality of chemical liquids may be sequentially supplied to the substrate W, and a rinsing liquid may be supplied to the substrate W between the chemical liquids.

The chemical liquid is not particularly limited, but is a dilute hydrofluoric acid (DHF), an aqueous solution containing ammonium hydroxide and hydrogen peroxide (SC-1), an aqueous solution containing hydrogen chloride and hydrogen peroxide (SC-2), an aqueous solution containing sulfuric acid and hydrogen peroxide (SPM), or the like. The chemical liquid may be an etching liquid that etches the substrate W.

The rinsing liquid is, for example, deionized water (DIW). The rinsing liquid is also used to remove a chemical liquid. The rinsing liquid is supplied to the central portion of the rotating substrate W and wet-spread over the entire top surface of the substrate W by a centrifugal force to wash away the chemical liquid remaining on the top surface of the substrate W. As a result, a liquid film of the rinsing liquid is formed on the top surface of the substrate W. The rinsing liquid may be supplied to the substrate W after one chemical liquid is supplied to the substrate W and before another chemical liquid is supplied to the substrate W.

The drying liquid is an organic solvent such as isopropyl alcohol (IPA). The organic solvent has a lower surface tension than the rinsing liquid. Therefore, it is possible to suppress the collapse of an uneven pattern due to surface tension. The drying liquid is supplied to the central portion of the rotating substrate W and is wet-spread over the entire top surface of the substrate W by a centrifugal force to exchange the rinsing liquid remaining on the top surface of the substrate W. As a result, a liquid film of the drying liquid is formed on the top surface of the substrate W.

The processing part 10 includes a cup 17 configured to recover the processing liquid L supplied to the substrate W. The cup 17 surrounds the peripheral edge of the substrate W held by the holder 12, and receives the chemical liquid scattered from the peripheral edge of the substrate W. Although the cup 17 does not rotate with the rotation shaft 14 in the present embodiment, the cup 17 may rotate with the rotation shaft 14. The bottom wall of the cup 17 is provided with a drainage pipe 17a configured to discharge the liquid accumulated inside the cup 17 and an exhaust pipe 17b configured to discharge the gas accumulated inside the cup 17.

As illustrated in FIG. 1, the substrate processing apparatus 1 includes a tank 20 that stores a processing liquid L, a circulation line 21 that takes out the processing liquid L from the tank 20 and returns the processing liquid L to the tank 20, and a branch line 22 branching from the circulation line 21. The processing part 10 supplies the processing liquid L to the substrate W at the end of the branch line 22. The processing liquid L is not particularly limited, but is, for example, IPA.

The tank 20 stores the processing liquid L. The processing liquid L is circulated from the tank 20 to the tank 20 via the circulation line 21. In the middle of the circulation line 21, for example, a pump 23, a flow meter 24, a heater 25, a thermometer (not illustrated), and a filter 26 are provided. The arrangement of these devices (the pump 23, the flow meter 24, the heater 25, the thermometer, and the filter 26) is not limited to the arrangement illustrated in FIG. 1.

The pump 23 circulates the processing liquid L. The flow meter 24 measures the flow rate of the processing liquid L. The controller 90 controls the pump 23 such that the measured value of the flow meter 24 becomes a set value. The heater 25 heats the processing liquid L. The thermometer measures the temperature of the processing liquid L. The controller 90 controls the heater 25 such that the measured value of the thermometer becomes a set value. The processing liquid L at a desired temperature may be supplied to the substrate W. The filter 26 collects foreign matter in the processing liquid L.

The branch line 22 connects the circulation line 21 to the nozzle 16 of the processing part 10. The branch line 22 is provided for each processing part 10. When the processing part 10 is of a batch type, the branch line 22 connects the circulation line 21 to the processing tank of the processing part 10. In the middle of the branch line 22, for example, a flow meter 27, a flow controller 28, and an opening/closing valve 29 are provided. The arrangement of these devices (the flow meter 27, the flow controller 28, and the opening/closing valve 29) is not limited to the arrangement illustrated in FIG. 1.

When the opening/closing valve 29 opens the branch line 22, the branch line 22 supplies the processing liquid L to the processing part 10. The flow meter 27 measures a flow rate of the processing liquid L. The controller 90 controls the flow controller 28 such that the measured value of the flow meter 27 becomes a set value. When the opening/closing valve 29 closes the branch line 22, the branch line 22 stops supplying the processing liquid L to the processing part 10.

A reflux line 30 may be provided in the middle of the branch line 22. The reflux line 30 branches from the branch line 22 and returns the processing liquid L to the tank 20. The reflux line 30 is provided for each processing part 10. For example, an opening/closing valve 31 is provided in the middle of the reflux line 30.

When the opening/closing valve 29 closes the branch line 22 and the opening/closing valve 31 opens the reflux line 30, the processing liquid L is returned to the tank 20 without being supplied to the processing part 10. Even while the processing part 10 does not consume the processing liquid L, the processing liquid L heated by the heater 25 may be continuously caused to flow to a portion of the branch line 22. Thus, it is possible to suppress the temperature reduction of the processing liquid L in the branch line 22.

When the opening/closing valve 29 opens the branch line 22 and the opening/closing valve 31 closes the reflux line 30, the processing liquid L is supplied to the processing part 10 without being returned to the tank 20. The processing liquid L supplied to the processing part 10 is consumed by the processing part 10. That is, the processing liquid L supplied to the processing part 10 is not returned to the tank 20 by being discharged to the exterior of the substrate processing apparatus 1. As a result, the storage amount H of the processing liquid L stored in the tank 20 is reduced.

The substrate processing apparatus 1 includes a discharge part 40 that reduces the storage amount H of the processing liquid L separately from the processing part 10. The discharge part 40 reduces the storage amount H of the processing liquid L, for example, when the processing liquid L is replaced in order to suppress deterioration of the processing liquid L. The discharge part 40 includes, for example, a first discharge part 41 and a second discharge part 42. The discharge part 40 may include only the first discharge part 41 or may include only the second discharge part 42.

The first discharge part 41 includes a first discharge line 43 connected to the tank 20 and a first opening/closing valve 44 that opens/closes the first discharge line 43. When the first opening/closing valve 44 opens the first discharge line 43, the first discharge line 43 discharges the processing liquid L from the tank 20 and reduces the storage amount H of the processing liquid L. When the first opening/closing valve 44 closes the first discharge line 43, the first discharge line 43 stops discharging the processing liquid L from the tank 20.

The second discharge part 42 includes a second discharge line 45 connected to the circulation line 21 and a second opening/closing valve 46 that opens and closes the second discharge line 45. When the second opening/closing valve 46 opens the second discharge line 45, the second discharge line 45 discharges the processing liquid L from the circulation line 21 and reduces the storage amount H of the processing liquid L. When the second opening/closing valve 46 closes the second discharge line 45, the second discharge line 45 stops discharging the processing liquid L from the circulation line 21.

The substrate processing apparatus 1 includes a supply part 50 that supplies a new processing liquid L to the tank 20. The supply part 50 includes a supply line 51 connected to the tank 20. The new processing liquid L is replenished to the tank 20 through the supply line 51. In the middle of the supply line 51, for example, a flow meter 52, a flow controller 53, and an opening/closing valve 54 are provided. The arrangement of these devices (the flow meter 52, the flow controller 53, and the opening/closing valve 54) is not limited to the arrangement illustrated in FIG. 1.

When the opening/closing valve 54 opens the supply line 51, the supply line 51 supplies the new processing liquid L to the tank 20. The flow meter 52 measures the flow rate of the processing liquid L. The controller 90 controls the flow controller 53 such that the measured value of the flow meter 52 becomes a set value. When the opening/closing valve 54 closes the supply line 51, the supply line 51 stops supplying the new processing liquid L to the tank 20.

The substrate processing apparatus 1 includes a plurality of detectors 61 to 64 that detect the storage amount H of the processing liquid L in the tank 20. The plurality of detectors 61 to 64 are installed at different heights and detect whether the processing liquid L is present at each installation position. Although not illustrated, the substrate processing apparatus 1 may include a float type detector, and the number of detectors may be one.

The substrate processing apparatus 1 includes a controller 90. The controller 90 is, for example, a computer, and includes a central processing unit (CPU) 91 and a non-transitory computer-readable storage medium 92 such as a memory. The storage medium 92 stores a program for controlling various processes executed in the substrate processing apparatus 1. The controller 90 controls the operation of the substrate processing apparatus 1 by causing the CPU 91 to execute the program stored in the storage medium 92.

Figure 3:
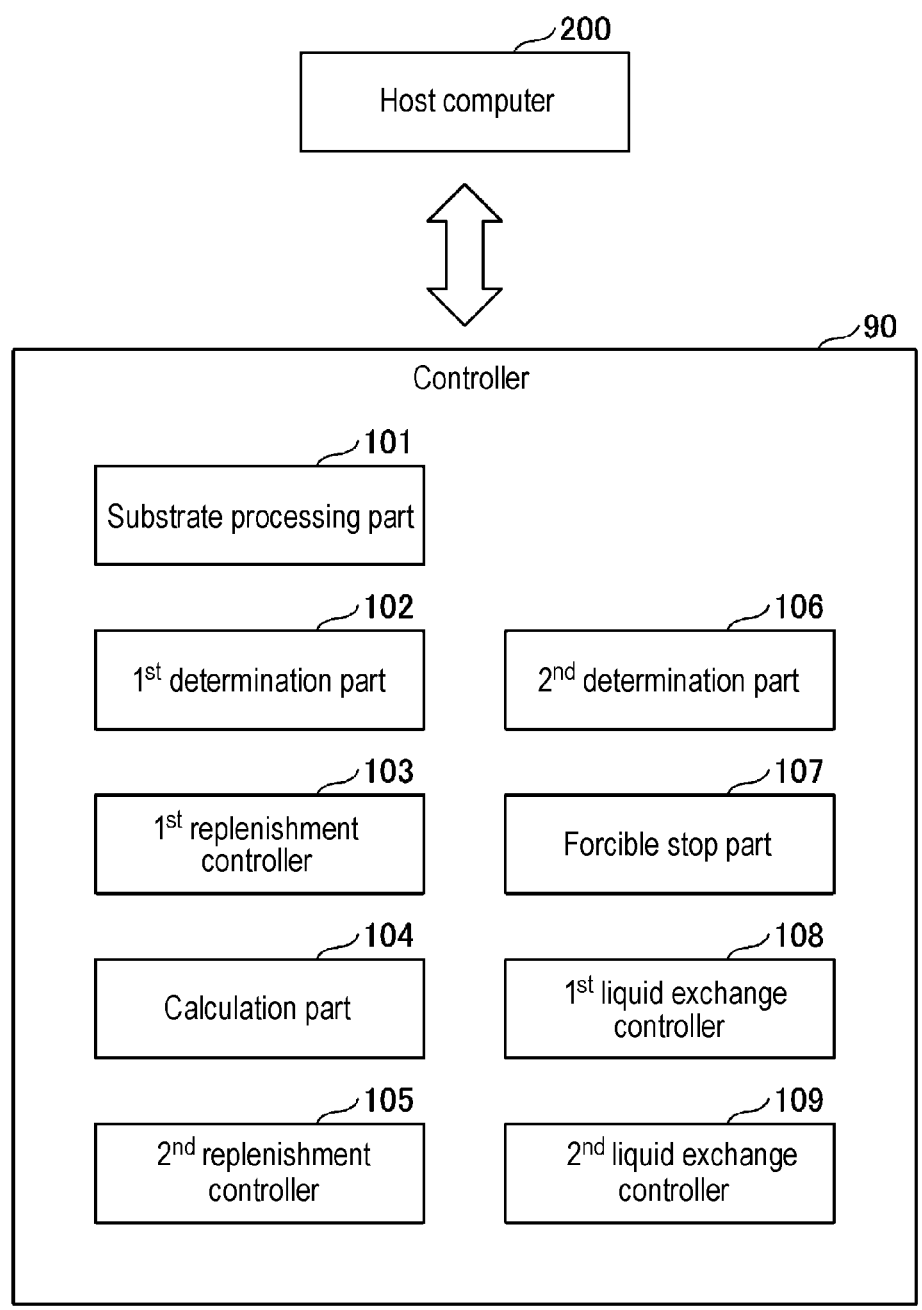
FIG. 3 is a view illustrating an example of components of a controller as a functional block.

As illustrated in FIG. 3, the controller 90 includes, for example, a substrate processing part 101, a first determination part 102, a first replenishment controller 103, a calculation part 104, a second replenishment controller 105, a second determination part 106, a forcible stop part 107, a first liquid exchange controller 108, and a second liquid exchange controller 109. Each functional block illustrated in FIG. 3 is conceptual and does not necessarily have to be physically configured as illustrated in the drawing.

It is possible to functionally or physically disperse/integrate all or some of respective functional blocks illustrated in FIG. 3 by arbitrary units. All or any part in each processing function performed in each function block may be implemented by a program executed by a CPU, or may be implemented as hardware by wired logic.

Figure 4:
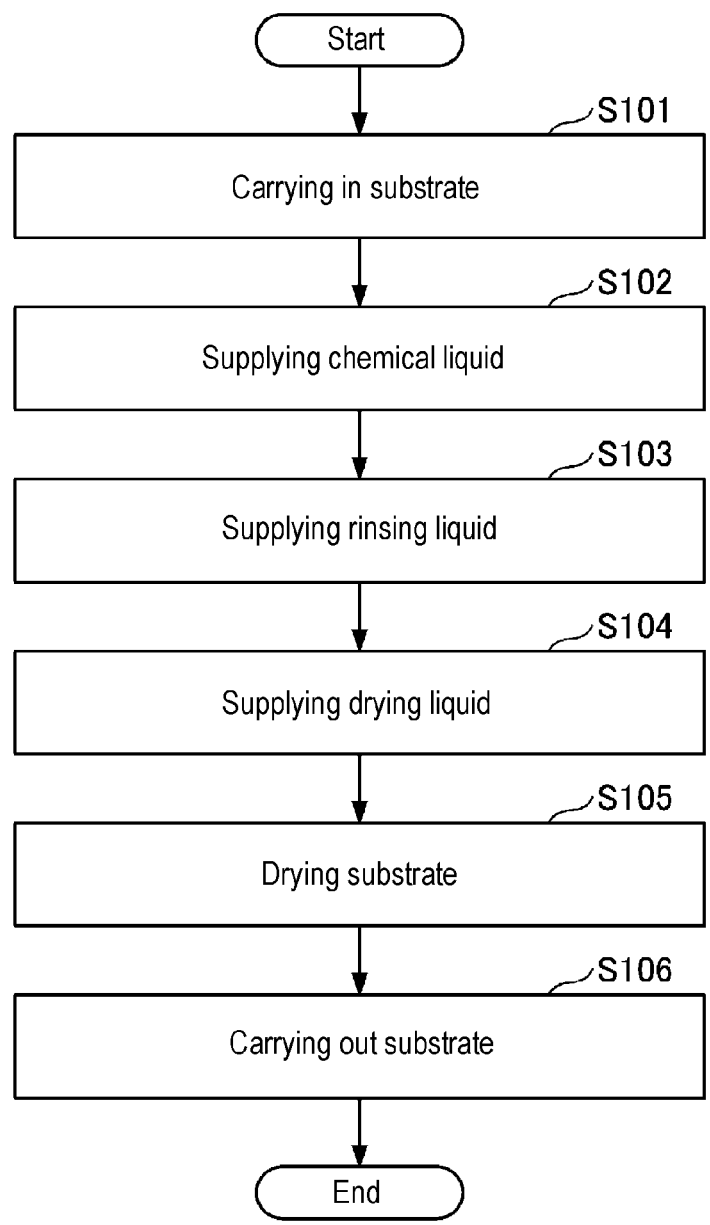
FIG. 4 is a flowchart illustrating an example of processing by a substrate processing part.

Next, an example of processing performed by the substrate processing part 101 will be described with reference to FIG. 4. Each of steps S101 to S106 illustrated in FIG. 4 is carried out under the control of the substrate processing part 101. The substrate processing part 101 processes a substrate W by supplying a processing liquid L to the substrate W.

First, a transfer device (not illustrated) carries the substrate W into the processing container 11 (step S101). After placing the substrate W on the holder 12, the transfer device is retracted from the interior of the processing container 11. The holder 12 holds the substrate W. Thereafter, the rotation part 13 rotates the substrate W together with the holder 12.

Subsequently, the nozzle 16 supplies a chemical liquid to the central portion of the rotating substrate W (step S102). The chemical liquid is wet-spread over the entire top surface of the substrate W by a centrifugal force to form a liquid film.

Subsequently, the nozzle 16 supplies a rinsing liquid to the central portion of the rotating substrate W (step S103). The rinsing liquid is wet-spread over the entire top surface of the substrate W by a centrifugal force, and the chemical liquid remaining on the top surface of the substrate W is washed away. As a result, a liquid film of the rinsing liquid is formed on the top surface of the substrate W.

Subsequently, the nozzle 16 supplies a drying liquid to the central portion of the rotating substrate W (step S104). The drying liquid is wet-spread over the entire top surface of the substrate W by a centrifugal force, and the rinsing liquid remaining on the top surface of the substrate W is washed away. As a result, a liquid film of the drying liquid is formed on the top surface of the substrate W.

Subsequently, the rotation part 13 rotates the substrate W, shakes off the drying liquid remaining on the top surface of the substrate W and dries the substrate W (step S105). After the substrate W is dried, the rotation part 13 stops the rotation of the substrate W.

Lastly, the holder 12 releases the holding of the substrate W, and then a transfer device (not illustrated) receives the substrate W from the holder 12 and carries the received substrate W to the exterior of the processing container 11 (step S106).

Figure 5:
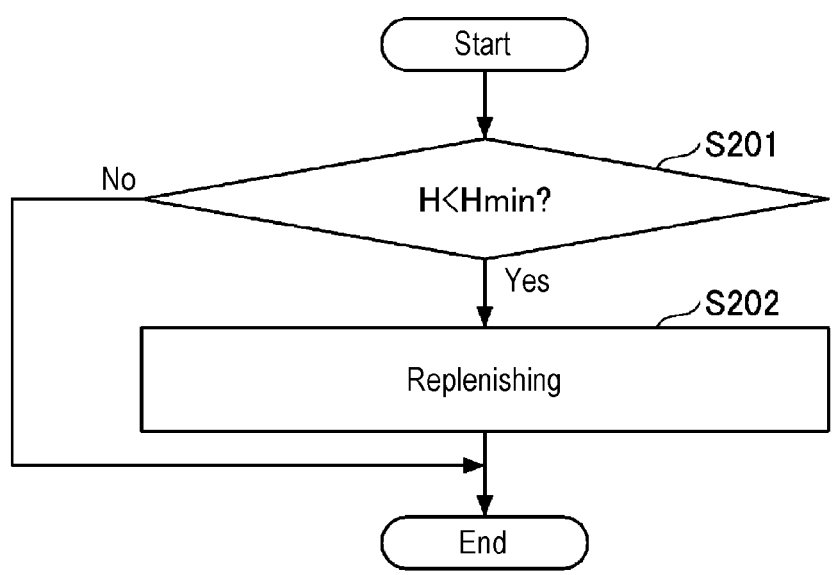
FIG. 5 is a flowchart illustrating an example of processing by a first determination part and a first replenishment controller.

Next, with reference to FIG. 5, an example of processing performed by the first determination part 102 and the first replenishment controller 103 will be described. The processing after step S201 illustrated in FIG. 5 is performed periodically while the processing liquid L is circulated.

First, the first determination part 102 determines whether a storage amount H of the processing liquid L in the tank 20 is less than the lower limit value Hmin (step S201). For this determination, for example, the detector 63 illustrated in FIG. 1 is used.

When the detector 63 does not detect the presence of the processing liquid L, the first determination part 102 determines that the storage amount H is less than a lower limit value Hmin. Meanwhile, when the detector 63 detects the presence of the processing liquid L, the first determination part 102 determines that the storage amount H is the lower limit value Hmin or more.

When the first determination part 102 determines that the storage amount H is less than the lower limit value Hmin ("YES" in step S201), the first replenishment controller 103 replenishes a new processing liquid L to the tank 20 by the supply part 50 (step S202). As a result, the storage amount H becomes the lower limit value Hmin or more.

The first replenishment controller 103 may replenish the new processing liquid L such that the storage amount H is the lower limit value Hmin or more and not more than an upper limit value Hmax. The fact that the storage amount H has reached the top limit value Hmax is detected by the detector 64 illustrated in FIG. 1.

When the first determination part 102 determines that the storage amount H is the lower limit value Hmin or more ("NO" in step S201), the first replenishment controller 103 does not replenish the new processing liquid L. Thereafter, the current processing is terminated.

Even when the processing part 10 consumes the processing liquid L, the first replenishment controller 103 replenishes the processing liquid L, so that the storage amount H of the tank 20 is maintained at a predetermined value or more. The storage amount H of the tank 20 is maintained within a permissible range defined by the lower limit value Hmin and the upper limit value Hmax.

Figure 6:
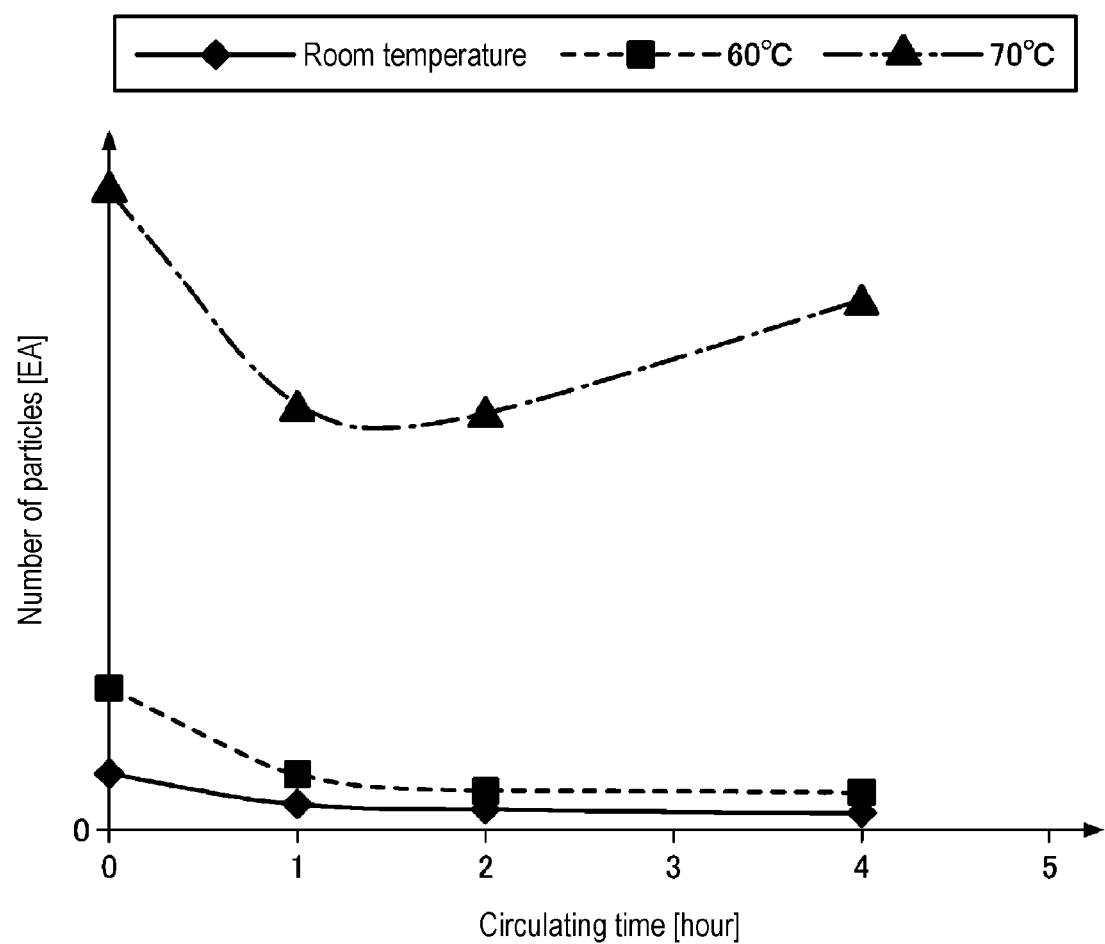
FIG. 6 is a diagram illustrating an example of a relationship of the number of particles adhering to a substrate, a circulation time, and the temperature of a processing liquid.

Next, with reference to FIG. 6, an example of a relationship of the number of particles adhering to a substrate W, a circulation time, and the temperature of a processing liquid will be described. The circulation time is the elapsed time from step S404 in FIG. 11, which will be described later, and is the elapsed time from the completion of the liquid exchange process. The details of the liquid exchange process will be described later. In FIG. 6, the processing liquid is IPA.

Figure 7A:
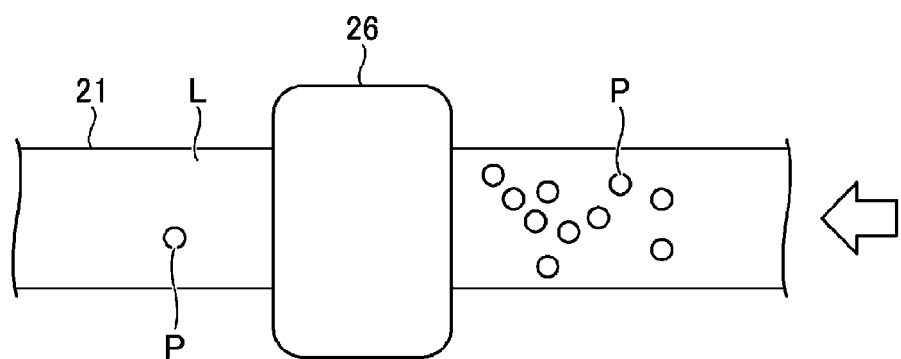
FIG. 7A is a view illustrating an example of a processing liquid at the start of circulation.

As illustrated in FIG. 6, immediately after the liquid exchange process, as the circulation time becomes longer, filtration progresses and the number of particles adhering to a substrate W decreases. Filtration is, as illustrated in FIG. 7A, collecting particles P contained in the processing liquid L by a filter 26.

Figure 7B:
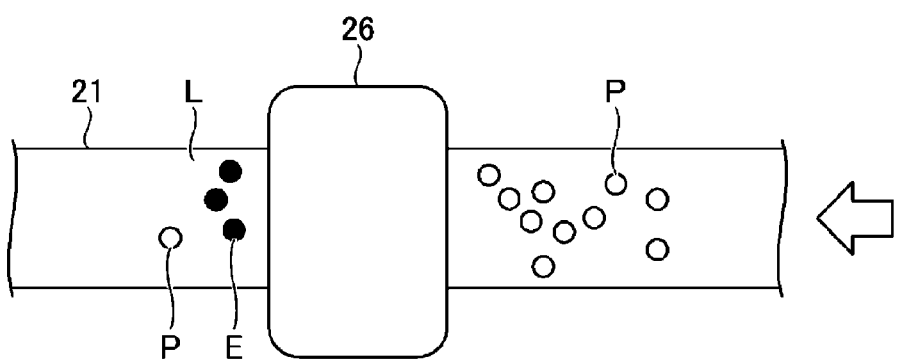
FIG. 7B is a view illustrating an example of elution from a filter.

As illustrated in FIG. 6, when the temperature of the processing liquid L is room temperature or 60 degrees C., the number of particles adhering to the substrate W gradually decreases and then comes into a steady state. When the temperature of the processing liquid L is 70 degrees C., the number of particles adhering to the substrate W may gradually decrease and then increase. When the temperature of the processing liquid L rises, as illustrated in FIG. 7B, it is considered that an eluate E elutes from the filter 26 into the processing liquid L, and the eluate E adheres to the substrate W as particles. The higher the temperature of the processing liquid L, the easier it is for the eluate E to elute, and the more particles adhere to the substrate W.

Figure 7C:
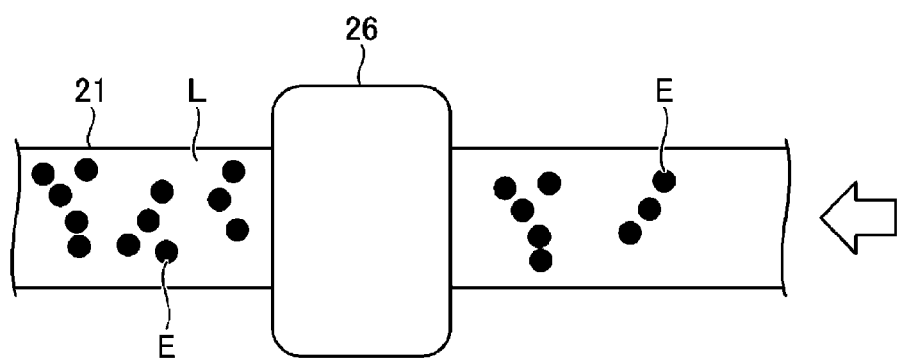
FIG. 7C is a view illustrating an example of slip-through of an eluted component.

The eluate E is dissolved in, for example, the processing liquid L, passes through the filter 26, and then precipitates as particles on the substrate W. Alternatively, the eluate E is not dissolved in the processing liquid L, but has a particle size sufficient to pass through the filter 26. In any case, the eluate E slips through the filter 26 as illustrated in FIG. 7C. It is considered that as the circulation time becomes longer, the eluate E accumulates and the number of particles adhering to the substrate W increases.

The device that produces the eluate E is not limited to the filter 26. Any device may cause an eluate E to be generated in the processing liquid when the device is provided in the circulation line 21. The relationship of the number of particles adhering to a substrate W, a circulation time, and the temperature of a processing liquid L varies depending on the composition of the processing liquid L and the material of the device.

Figure 7D:
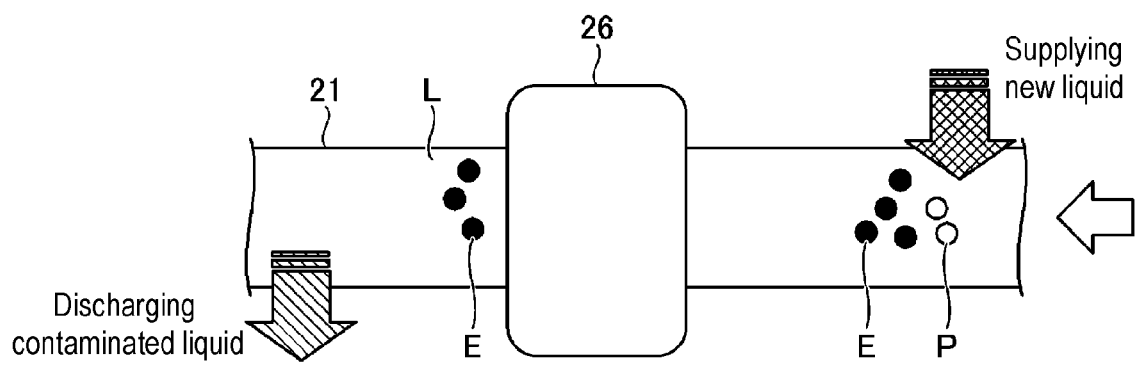
FIG. 7D is a view illustrating an example of replenishment and discharge of the processing liquid.

In the present embodiment, as illustrated in FIG. 7D, a processing liquid L contaminated with an eluate E is discharged, and instead, a new processing liquid L is replenished to the tank 20. As a result, the eluate E is suppressed from adhering to a substrate W as particles, and the increase of particles due to the circulation of the processing liquid L is suppressed.

Figure 8:
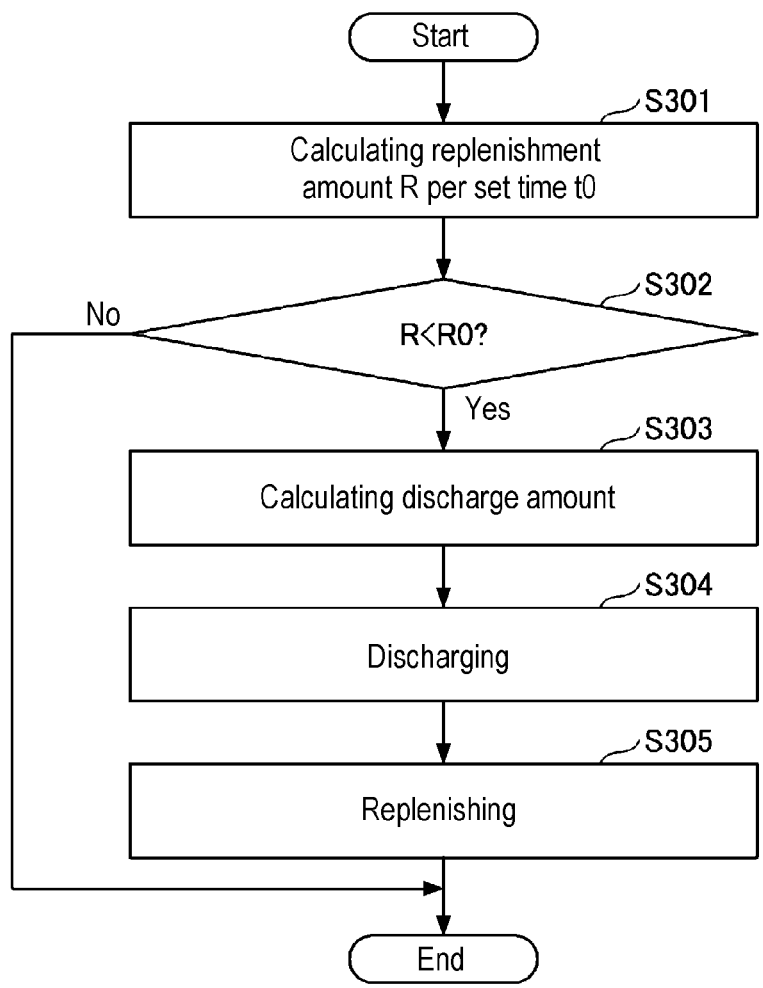
FIG. 8 is a flowchart illustrating an example of processing by a calculation part and a second replenishment controller.

Next, with reference to FIG. 8, an example of processing performed by the calculation part 104 and the second replenishment controller 105 will be described. The processing after step S301 illustrated in FIG. 8 is performed in parallel with the processing after step S201 illustrated in FIG. 5, and are performed while the processing liquid L is being circulated.

First, the calculation part 104 calculates a replenishment amount R of the processing liquid L to be replenished to the tank 20 per set time t0 by the supply part 50 (step S301). The set time t0 is, for example, 1 hour, but may be 10 minutes. The set time t0 is appropriately changed. Hereinafter, the replenishment amount R per set time t0 is also simply referred to as a replenishment amount R.

The replenishment of the processing liquid L is performed, for example, when the first determination part 102 determines that the storage amount H is less than the lower limit value Hmin, as illustrated in FIG. 5 ("YES" in step S201). The larger the consumption amount of the processing liquid L consumed by the processing part 10, the easier it is for the storage amount H to decrease, and the larger the replenishment amount R. The replenishment amount R and the consumption amount are equivalent.

The processing part 10 consumes the processing liquid L when processing a substrate W. Even while the processing of a substrate W is interrupted, the nozzle 16 periodically discharges the processing liquid L so that the processing liquid L does not stay around the nozzle 16 for a long time. Therefore, the processing part 10 consumes the processing liquid L even while the processing of the substrate W is interrupted.

However, during the period in which the processing of a substrate W is interrupted, the consumption amount of the processing liquid L is small and the replenishment amount R is also small compared with those during the period in which the processing of a substrate W is executed. In addition, the smaller the number of substrates W processed per set time to, the smaller the consumption amount of the processing liquid L and the smaller the replenishment amount R. The replenishment amount R and the consumption amount vary depending on the operating situation of the substrate processing apparatus 1.

The calculation part 104 calculates the replenishment amount R from, for example, the measured value of the flow meter 52 provided in the supply line 51. In this case, the calculation part 104 calculates the replenishment amount R by integrating the measured values of the flow meter 52 for the set time to.

The calculation part 104 may receive a processing plan including the processing timing of the substrate W from a host computer 200 and calculate the replenishment amount R from the processing plan. The calculation part 104 calculates the replenishment amount R by calculating the number of substrates W to be processed per set time t0 from the processing timing of the substrates W and calculating the consumption amount of the processing liquid L.

The host computer 200 is provided outside the substrate processing apparatus 1 and transmits the processing plan to the substrate processing apparatus 1. In addition to the processing timing of substrates W, the processing plan may include the supply time of the processing liquid L to the substrates W and the supply flow rate of the processing liquid L to the substrates W. As the supply time and the supply flow rate, those stored in advance in the controller 90 may be read out and used.

Subsequently, the second replenishment controller 105 checks whether the calculated value of the replenishment amount R calculated by the calculation part 104 is less than the set value R0 (step S302). The set value R0 is set such that the proportion of the eluate E in the processing liquid L is small and the number of particles adhering to the substrates W is the threshold value or less.

When the set value R0 becomes larger to some extent, even if the set value R0 increases, the number of particles adhering to the substrate W does not substantially decreases, and the amount of waste of the processing liquid L becomes unnecessarily large. Therefore, the set value R0 is set in consideration of the discharge amount in step S304.

When the calculated value of the replenishment amount R is the set value R0 or more ("NO" in step S302), the replenishment amount R and the consumption amount are large, and the proportion of the eluate E in the processing liquid L is small. In this case, the second replenishment controller 105 terminates the current process.

When the calculated value of the replenishment amount R is less than the set value R0 ("YES" in step S302), the replenishment amount R and the consumption amount are small, and the proportion of the eluate E in the processing liquid L is large. In this case, the second replenishment controller 105 determines the discharge amount for reducing the storage amount H of the tank 20 (step S303). The discharge amount is, for example, the same amount as the difference between the set value R0 and the calculated value.

Subsequently, the second replenishment controller 105 reduces the storage amount H of the tank 20 by the discharge part 40 or the processing part 10 (step S304). The second replenishment controller 105 uses the first discharge part 41 in order to reduce the storage amount H in a short period of time, but the second discharge part 42 or the processing part 10 may be used.

When the storage amount H of the tank 20 is reduced to be less than the lower limit value Hmin, the second replenishment controller 105 may prohibit the control performed by the first replenishment controller 103. Since the processing liquid L contaminated with the eluate E is discharged and then the new processing liquid L is replenished, it is possible to reduce the discharge amount and the replenishment amount compared with the case in which the discharge and the replenishment are performed at the same time.

Subsequently, the second replenishment controller 105 replenishes the new processing liquid L to the tank 20 by the supply part 50 (step S305). The replenishment amount is equal to, for example, the discharge amount, and equal to the difference between the set value R0 and the calculated value. By this replenishment, the proportion of the eluate E in the processing liquid L is reduced, and the number of particles adhering to the substrate W is reduced.

Figure 9:
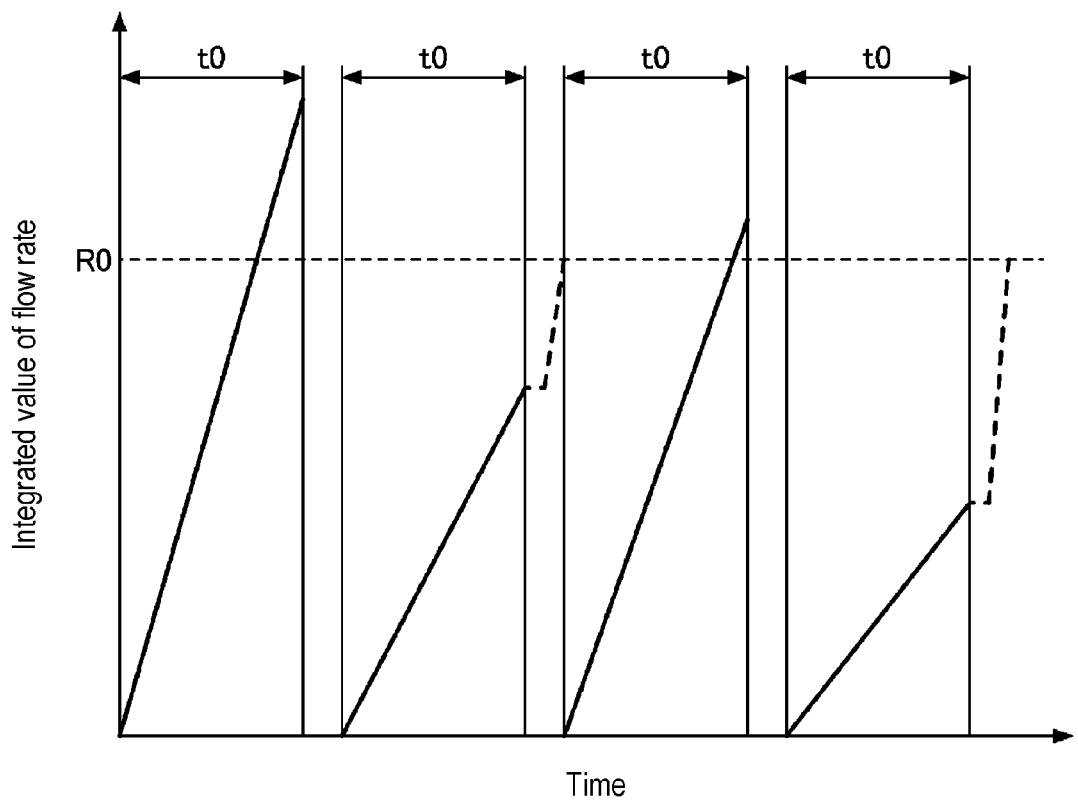
FIG. 9 is a view illustrating an example of a result of the processing of FIG. 8.

Next, an example of the results of processing of FIG. 8 will be described with reference to FIG. 9. In FIG. 9, the horizontal axis represents time, and the vertical axis represent an integrated value of the flow rate of a new processing liquid L replenished from the supply part 50 to the tank 20. The integrated value is calculated at every set time to. The integrated value may be calculated by using the flow meter 52 or may be calculated by using the processing plan transmitted from the host computer 200.

When the replenishment amount R per set time t0 is less than the set value R0, steps S303 to S305 illustrated in FIG. 8 are executed, and the new processing liquid L is replenished from the supply part 50 to the tank 20 as indicated by the broken line in FIG. 9. When the replenishment amount R per set time t0 is the set value R0 or more, steps S303 to S305 illustrated in FIG. 8 are not executed.

Next, with reference to FIG. 10, an example of a relationship of the number of particles adhering to a substrate W, a circulation time, and a replenishment amount R will be described. The circulation time is the elapsed time from step S404 in FIG. 11, which will be described later, and is the elapsed time from the completion of the liquid exchange process. The details of the liquid exchange process will be described later.

Figure 10:
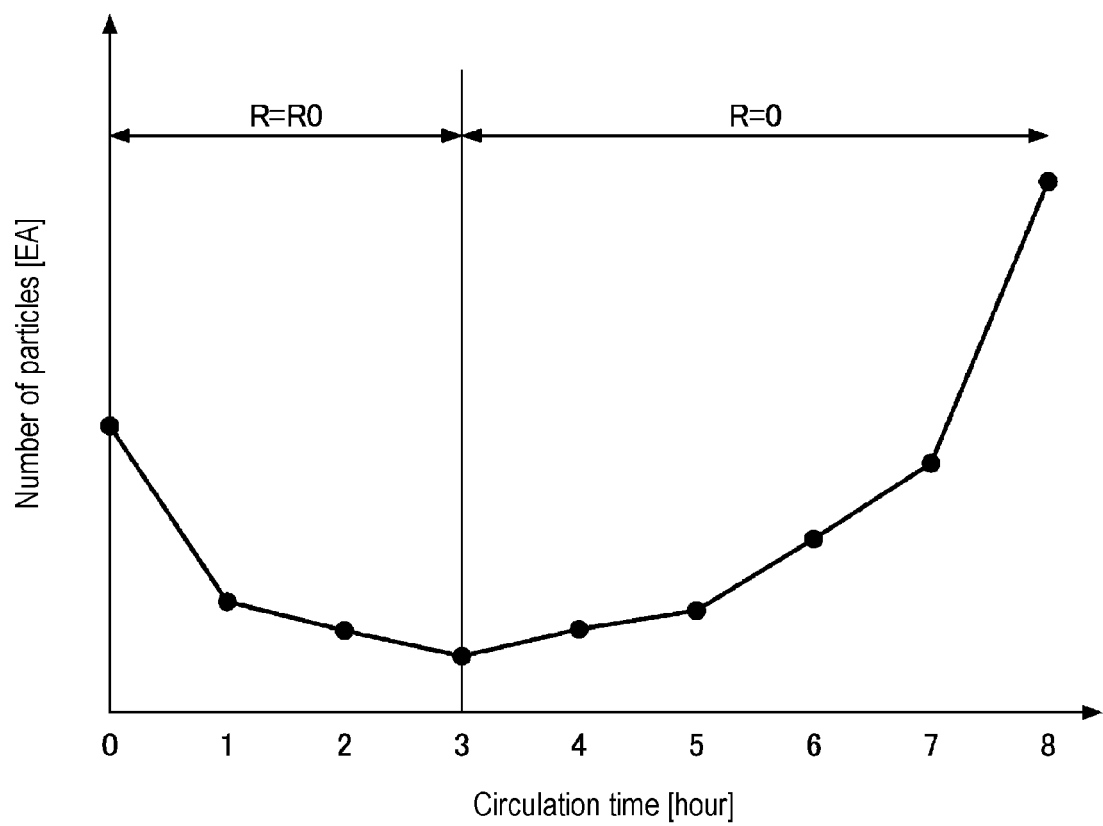
FIG. 10 is a diagram showing an example of a relationship of the number of particles adhering to a substrate, a circulation time, and a replenishment amount R.

As illustrated in FIG. 10, while the actual value of the replenishment amount R was equal to the set value R0, as the circulation time became longer, the filtration progressed and the number of particles adhering to the substrate W decreased. Thereafter, when the actual value of the replenishment amount R became zero, the proportion of the eluate E in the processing liquid L increased as the circulation time became longer, and the number of particles adhering to the substrate W increased. From these points, it can be seen that by managing the replenishment amount R at the set value R0 or more, the increase of particles due to the circulation of the processing liquid L can be suppressed.

Figure 11:
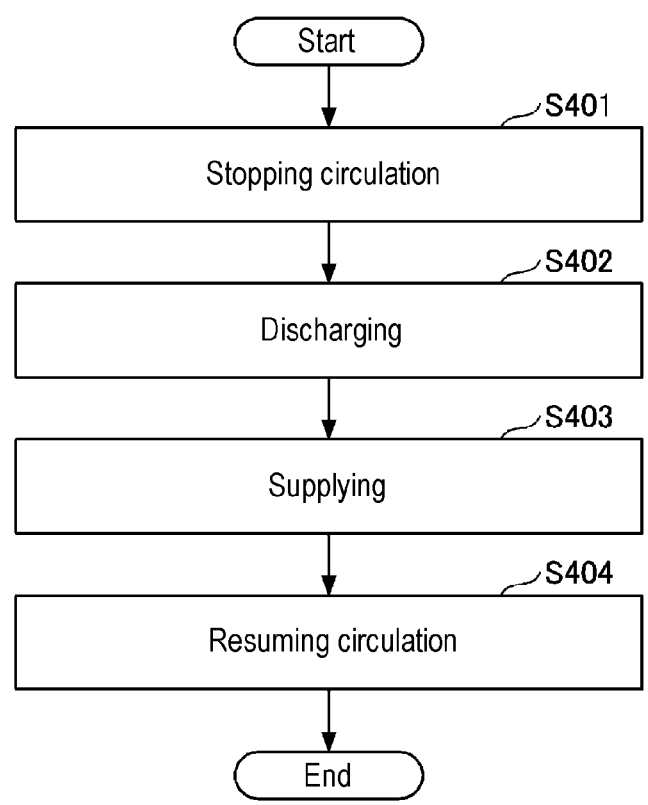
FIG. 11 is a flowchart illustrating an example of processing by a second liquid exchange controller.

Next, an example of the processes of the second liquid exchange controller 109 will be described with reference to FIG. 11. The processing after S401 illustrated in FIG. 11 is initiated when the second liquid exchange controller 109 receives a liquid exchange command for exchanging the processing liquid L in circulation. The liquid exchange command is transmitted from, for example, the host computer 200.

The processing liquid L in circulation is present, for example, the tank 20, the circulation line 21, the devices (the pump 23, the flow meter 24, the heater 25, the thermometer, and the filter 26) provided in the circulation line 21, the branch line 22, the devices (the flow meter 27 and the flow controller 28) provided in the branch line 22, the reflux line 30, and the device (the opening/closing valve 31) provided in the reflux line 30. A ratio of the volume of the processing liquid L in the tank 20 to the total volume of the processing liquid L in circulation is not particularly limited, but is, for example, 30% to 50%.

By exchanging the processing liquid L periodically, it is possible to suppress deterioration of the processing liquid L. An inert gas, such as nitrogen gas, is supplied to the upper space of the tank 20, but the air may enter. Since the moisture in the air gradually dissolves in the processing liquid L, the processing liquid L is deteriorated. The concentration of moisture of the new processing liquid L may be lower than the concentration of moisture of the processing liquid L stored in the tank 20, and may be substantially zero.

First, when receiving the liquid exchange command, the second liquid exchange controller 109 stops the pump 23 and stops the circulation of the processing liquid L (step S401). By stopping the pump 23, it is possible to prevent the pump 23 from running idle in the process of emptying the tank 20. The second liquid exchange controller 109 may stop the pump 23 and may also stop the heater 25. By stopping the circulation of the processing liquid L, it is possible to prevent some of the processing liquid L from being intensively overheated.

Processing performed by the second liquid exchange controller 109 and processing performed by the first liquid exchange controller 108, which will be described later, are selectively executed. When receiving the liquid exchange command and receiving a command for prohibiting processing by the first liquid exchange controller 108, the second liquid exchange controller 109 may initiate the processing after step S401.

Subsequently, the second liquid exchange controller 109 reduces the storage amount H of the tank 20 by the discharge part 40 in the state in which the pump 23 is stopped (step S402). Since the circulation of the processing liquid L is stopped, the second liquid exchange controller 109 reduces the storage amount H by using the first discharge part 41 rather than the second discharge part 42. As a result, the tank 20 is emptied out.

Subsequently, the second liquid exchange controller 109 supplies the processing liquid L to the tank 20 by the supply part 50 (step S403).

Lastly, the second liquid exchange controller 109 restarts the pump 23 to resume the circulation of the processing liquid L (step S404). The second liquid exchange controller 109 may restart the pump 23 and may also restart the heater 25.

The timing for restarting the pump 23 is after step S403 in the present embodiment, but the timing may be after the storage amount H of the tank 20 exceeds a first threshold value H1 to be described later, and may be in the middle of step S403. The timing for restarting the heater 25 may be after or at the same time as the timing for restarting the pump 23.

The first threshold value H1 is smaller than the lower limit value Hmin (H1<Hmin). The first threshold value H1 is used for the determination of the second determination part 106. The second determination part 106 determines whether the storage amount H of the tank 20 is less than the first threshold value H1 during the circulation of the processing liquid L. For this determination, for example, the detector 61 illustrated in FIG. 1 is used.

When the second determination part 106 determines that the storage amount H is less than the first threshold value H1, the forcible stop part 107 stops the pump 23. When an abnormality occurs in the circulation of the processing liquid L and the storage amount H decreases, the idle operation of the pump 23 can be prevented and the failure of the pump 23 can be prevented.

When the pump 23 is restarted, the number of particles P contained in the processing liquid L increases. Particles P are generated, for example, by friction between components constituting the pump 23. Particles P are also generated by being separated by vibration from the circulation line 21 or the devices (the pump 23, the flow meter 24, the heater 25, the thermometer, and the filter 26). In addition, when the heater 25 is restarted, the filter 26 thermally expands and particles P are detached from the filter 26. Therefore, immediately after the liquid exchange process, the number of particles P increases.

Meanwhile, unlike the second liquid exchange controller 109, the first liquid exchange controller 108, which will be described later, executes reducing of the storage amount H of the tank 20 by the discharge part 40 and supplying of the new processing liquid L to the tank 20 by the supply part 50 in the state in which the processing liquid L is circulated by the pump 23. Since the pump 23 is not stopped, the pump 23 is not restarted. In addition, since the pump 23 is not stopped, the heater 25 is not stopped. Therefore, it is possible to suppress an increase in the number of particles P immediately after the liquid exchange process.

Figure 12:
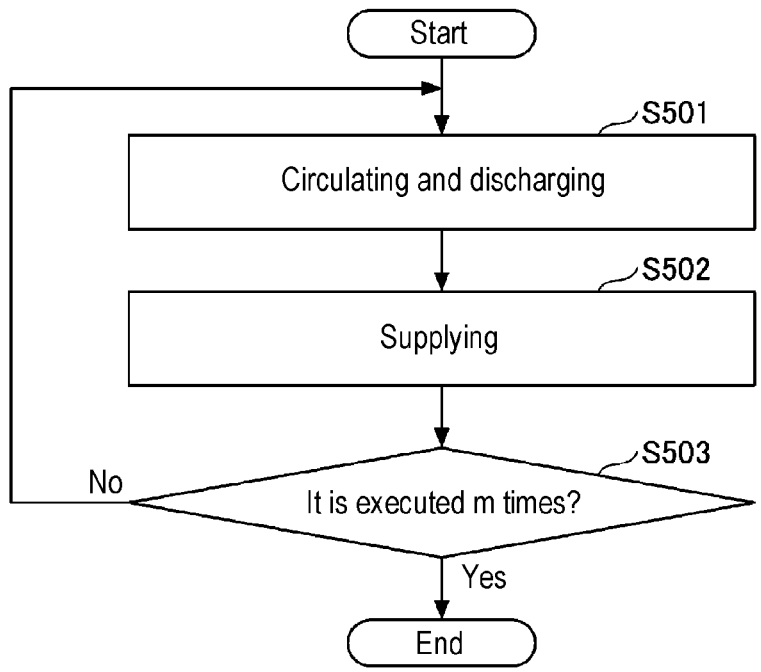
FIG. 12 is a flowchart illustrating an example of processing by a first liquid exchange controller.

Next, an example of the processes of the first liquid exchange controller 108 will be described with reference to FIG. 12. The processing after S501 illustrated in FIG. 12 is initiated when the first liquid exchange controller 108 receives a liquid exchange command. Processing performed by the first liquid exchange controller 108 and processing performed by the second liquid exchange controller 109 are selectively executed. When receiving the liquid exchange command and receiving a command for prohibiting processing by the second liquid exchange controller 109, the first liquid exchange controller 108 may initiate the processing after step S501.

When receiving the liquid exchange command, the first liquid exchange controller 108 reduces the storage amount H of the tank 20 by the discharge part 40 in the state in which the processing liquid L is circulated by the pump 23 (step S501). Since the first liquid exchange controller 108 continuously circulates the processing liquid L, the processing liquid L may be continuously heated by the heater 25.

When receiving the liquid exchange command, the first liquid exchange controller 108 may reduce the storage amount H of the tank 20 to the second threshold value H2 by the discharge part 40 in the state in which the processing liquid L is circulated by the pump 23. The second threshold value H2 is larger than the first threshold value H1 and smaller than the lower limit value Hmin (H1<H2<Hmin). The fact that the storage amount H has reached the second threshold value H2 is detected by the detector 62 illustrated in FIG. 1. Since the storage amount H is maintained at the first threshold value H1 or more, it is possible to prevent the pump 23 from being stopped by the forcible stop part 107.

Unlike the second liquid exchange controller 109, the first liquid exchange controller 108 may reduce the storage amount H of the tank 20 by using the second discharge part 42. Since the circulation of the processing liquid L is not stopped, it is possible to use the second discharge part 42. When the second discharge part 42 is used, it is possible to cause the processing liquid L to reliably flow to the circulation line 21 compared with the case in which the first discharge part 41 is used.

Subsequently, the first liquid exchange controller 108 supplies the processing liquid L to the tank 20 by the supply part 50 in the state in which the processing liquid L is circulated by the pump 23 (step S502). The storage amount H of the processing liquid L stored in the tank 20 is returned to the lower limit value Hmin or more.

Subsequently, the first liquid exchange controller 108 checks whether steps S501 and S502 have been performed m times (step S503). m is a natural number of 1 or more and is preset such that the ratio of the new processing liquid L to the total volume of the processing liquid L in circulation is a desired value or more. m may be changed as appropriate. m is preferably a natural number of 2 or more. The ratio of the new processing liquid L is the ratio of the new processing liquid L supplied after the start of step S501.

When the number of executions of steps S501 and S502 has not reached m times ("NO" in step S503), the first liquid exchange controller 108 executes steps S501 and S502 again. Meanwhile, when the number of executions of steps S501 and S502 has reached m times ("YES" in step S503), the first liquid exchange controller 108 terminates the current process.

Figure 13:
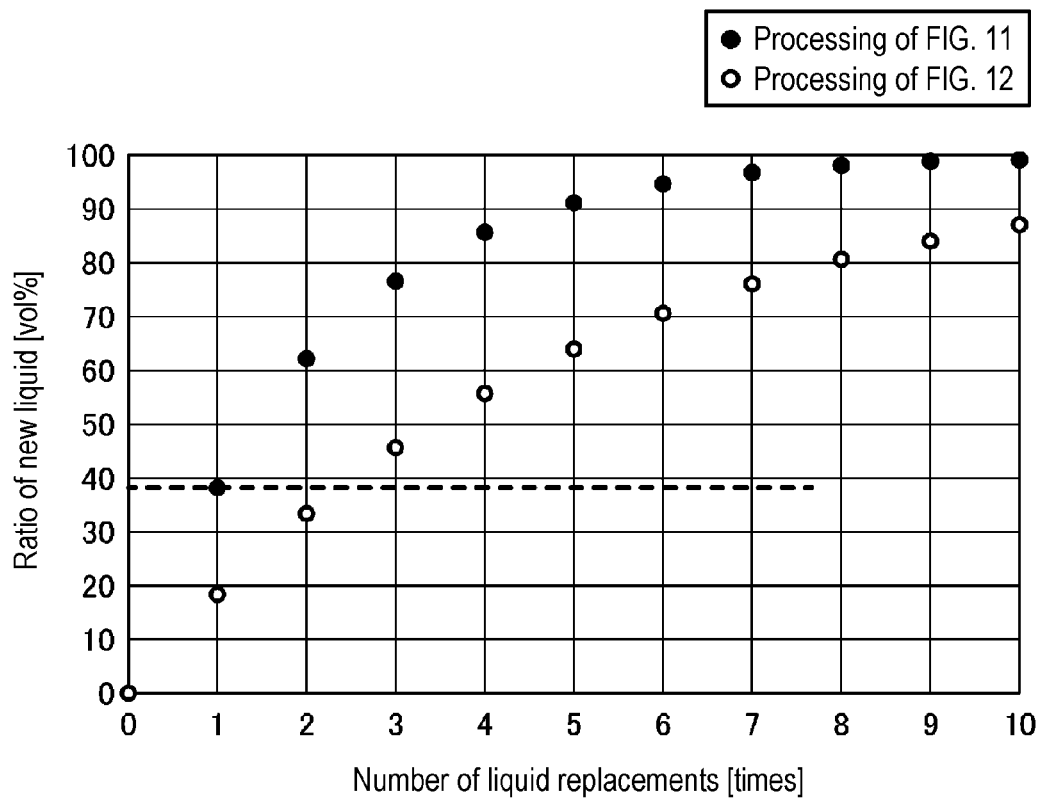
FIG. 13 is a diagram showing an example of a relationship between the number of liquid exchanges and the ratio of new liquid.

Next, an example of the relationship between the number of liquid exchanges and a ratio of new liquid will be described with reference to FIG. 13. The ratio of new liquid is the ratio of the new processing liquid L to the total volume of the processing liquid L in circulation. The number of liquid exchanges is the number of times of executing steps S401 to S404 in FIG. 11 or the number of times of executing steps S501 to S502 in FIG. 12. The ratio of the new processing liquid L is the ratio of the new processing liquid L supplied after the start of step S401 or step S501.

As the number of liquid exchanges increases, the ratio of new liquid increases. When the processing of FIG. 12 is performed, the old processing liquid L is discharged and the new processing liquid L is supplied without stopping the circulation of the processing liquid L. Thus, the old processing liquid L and the new processing liquid L are mixed with each other. Therefore, when the processing of FIG. 12 is performed, the increasing rate of the ratio of new liquid is slower than that in the case of performing the processing of FIG. 11. In order to sufficiently increase the ratio of new liquid, m in FIG. 12 is preferably a natural number of 2 or more, and more preferably 3 or more.

Figure 14:
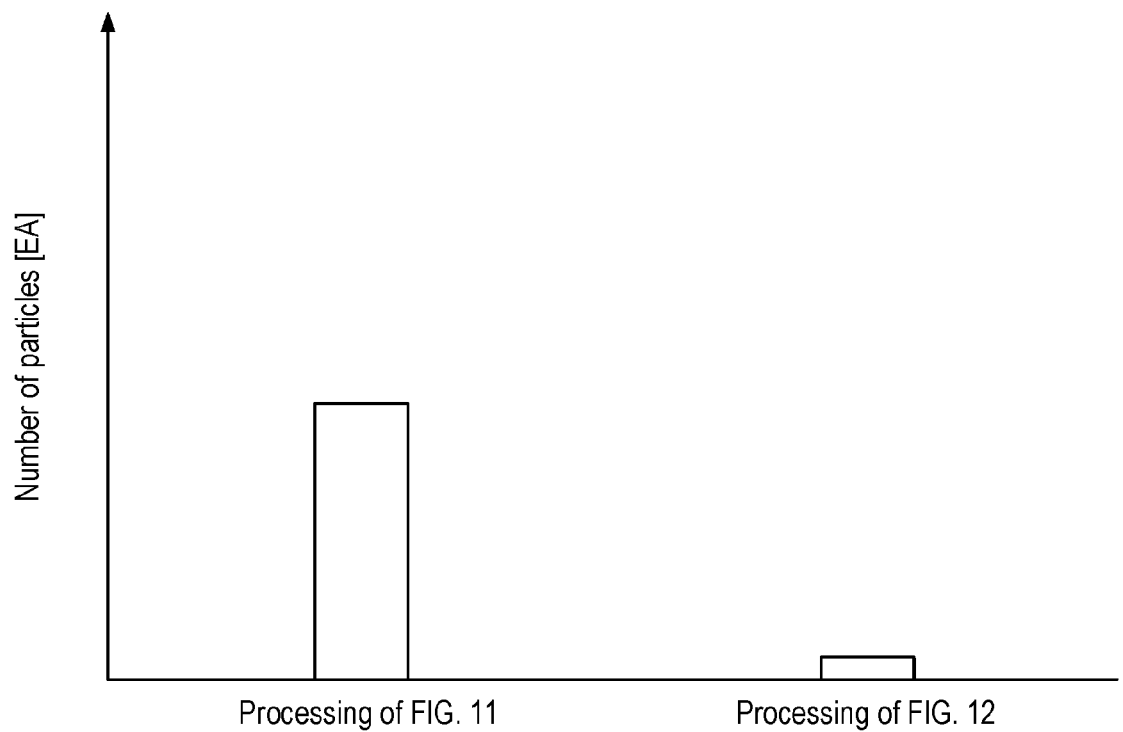
FIG. 14 is a diagram showing an example of the number of particles adhering to a substrate immediately after liquid exchange

Next, with reference to FIG. 14, an example of the number of particles adhering to a substrate W immediately after liquid exchange will be described. The number of liquid exchanges was set so that the ratio of new liquid was substantially the same. As is clear from FIG. 14, when the liquid exchange in FIG. 12 was performed, the circulation of the processing liquid was not stopped. Therefore, it was possible to suppress the number of particles adhering to the substrate W to about ¼ of that in the case in which the liquid exchange in FIG. 11 was performed.

Figure 15:
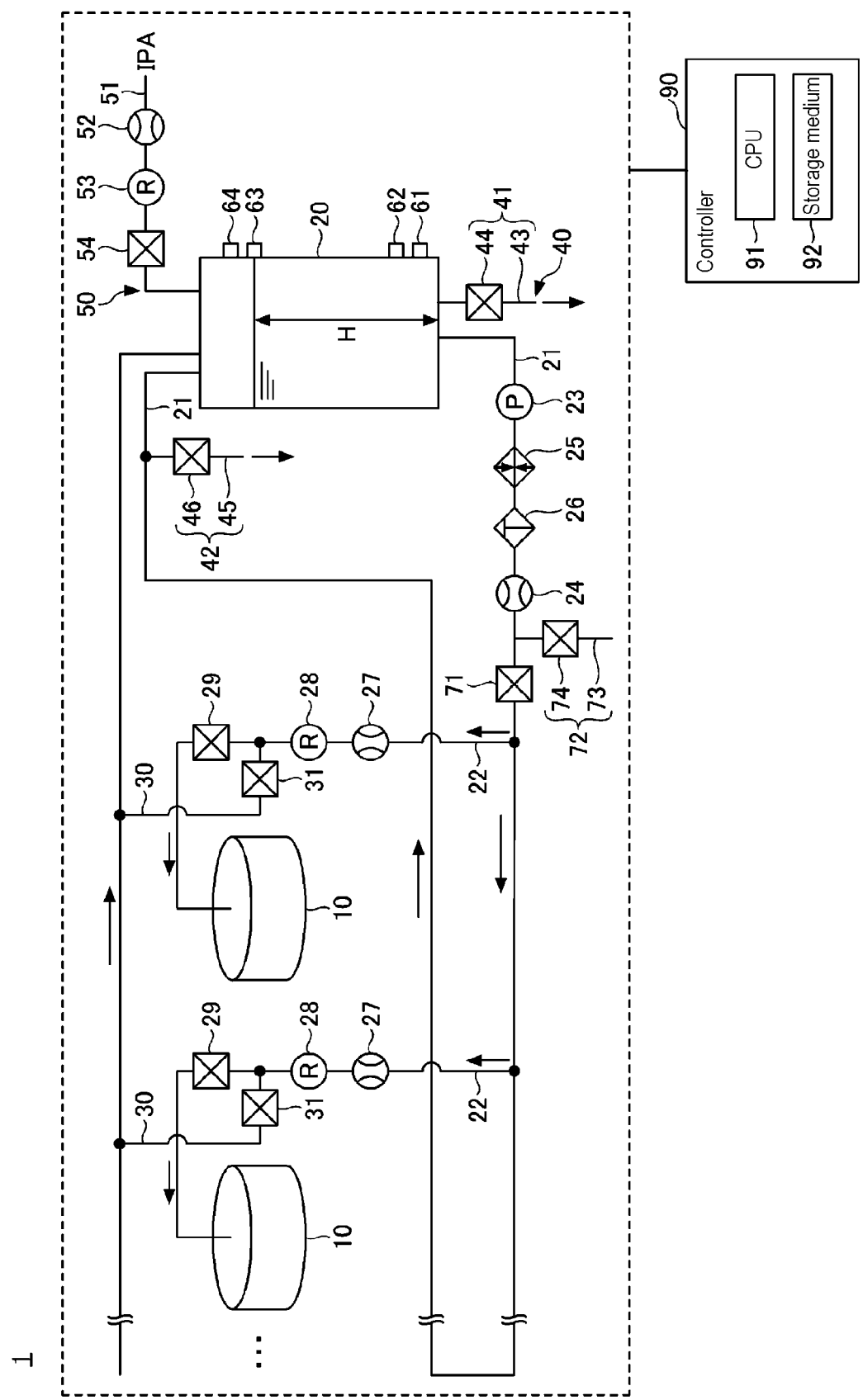
FIG. 15 is a view illustrating a substrate processing apparatus according to a modification.

Next, a substrate processing apparatus 1 according a modification will be described with reference to FIG. 15. The differences will be mainly described below. The substrate processing apparatus 1 of the present modification includes a filter 26 provided downstream of the pump 23 in the circulation line 21, an opening/closing valve 71 provided downstream of the filter 26 in the circulation line 21, and a processing liquid discharge part 72 that discharges the processing liquid L from the middle of the filter 26 and the opening/closing valve 71 in the circulation line 21.

The processing liquid discharge part 72 includes a discharge line 73 connected to the circulation line 21 between the filter 26 and the opening/closing valve 71, and an opening/closing valve 74 that opens/closes the discharge line 73. When the opening/closing valve 74 opens the discharge line 73, the discharge line 73 discharges the processing liquid L from the circulation line 21. When the opening/closing valve 74 closes the discharge line 73, the discharge line 73 stops discharging the processing liquid L from the circulation line 21.

The second liquid exchange controller 109 (see FIG. 3) stops the pump 23 in step S401 of FIG. 11 and then starts the pump 23 in step S404. A high driving force is required to start the pump 23. The high driving force causes particles to be generated from the filter 26 or the like.

The particles contaminate the circulation line 21. Once the circulation line 21 is contaminated with the particles, it takes a long time and a large amount of processing liquid L to clean the circulation line 21.

Therefore, when starting the pump 23 after stopping the pump 23, the second liquid exchange controller 109 executes closing of the circulation line 21 by the opening/closing valve 71 and discharging of the processing liquid L from the circulation line 21 by the processing liquid discharge part 72. It is possible to discharge the particles generated when the pump 23 is started to the discharge line 73, and to suppress contamination of the circulation line 21. Therefore, it is possible to shorten the time required for filtration until the processing of a substrate W is resumed, and to reduce the used amount of the processing liquid L.

For example, when the elapsed time from the start of the pump 23 reaches a set time, the second liquid exchange controller 109 opens the circulation line 21 by the opening/ closing valve 71, stops the discharge of the processing liquid L by the processing liquid discharge part 72, and resumes the circulation of the processing liquid L (step S404 in FIG. 11). The set time is set in consideration of the time until the particles generated at the start of the pump 23 reach the discharge line 73.

The opening/closing valve 71 and the processing liquid discharge part 72 may be provided on the upstream side of the connection point between at least one branch line 22 and the circulation line 21. This makes it possible to suppress not only the contamination of the circulation line 21 but also the contamination of the branch line 22. Further, the opening/closing valve 71 and the processing liquid discharge part 72 may be provided on the upstream side of the connection points of all the branch lines 22 and the circulation line 21.

According to a first aspect of the present disclosure, it is possible to suppress an increase of particles due to the circulation of a processing liquid. According to a second aspect of the present disclosure, it is possible to suppress an increase of particles due to the exchange of a processing liquid.

Although the embodiments of the substrate processing apparatus and the substrate processing method according to the present disclosure have been described above, the present disclosure is not limited to the above-described embodiments. Various changes, modifications, substitutions, additions, deletions, and combinations can be made within the scope of the claims. Of course, these also fall within the technical scope of the present disclosure.

What is claimed is:

1. A substrate processing apparatus comprising:
a tank that stores a processing liquid;
a circulation line configured to remove the processing liquid from the tank and return the processing liquid to the tank;
a branch line branching from the circulation line;
a processing part configured to supply the processing liquid to a substrate at an end of the branch line;
a discharge part configured to reduce a storage amount of the processing liquid stored in the tank;
a supply part configured to supply a new processing liquid to the tank; and
a controller configured to control the processing part, the discharging part, and the supply part,
wherein the controller includes:
a first determination part configured to determine whether or not the storage amount of the processing liquid stored in the tank is less than a lower limit value;
a first replenishment controller configured to replenish the processing liquid to the tank by the supply part when the first determination part determines that the storage amount of the processing liquid is less than the lower limit value;
a calculation part configured to calculate a replenishment amount of the processing liquid to be replenished to the tank per set time by the supply part; and
a second replenishment controller configured to reduce the storage amount of the processing liquid in the tank by the discharge part and replenish the processing liquid to the tank by the supply part when a calculation value of the replenishment amount calculated by the calculation part is less than a set value.

2. The substrate processing apparatus of claim 1, wherein the supply part includes a supply line connected to the tank and a flow meter configured to measure a flow rate of the processing liquid passing through the supply line, and
the calculation part calculates the replenishment amount from a measurement value measured by the flow meter.

3. The substrate processing apparatus of claim 2, wherein the calculation part receives a processing plan including a processing timing of the substrate from an external host computer and calculates the replenishment amount from the processing plan and the measurement value of the flow meter.

4. The substrate processing apparatus of claim 1, wherein the calculation part receives a processing plan including a processing timing of the substrate from an external host computer and calculates the replenishment amount from the processing plan.

5. The substrate processing apparatus of claim 1, wherein, when the storage amount of the processing liquid in the tank is reduced to be less than the lower limit value, the second replenishment controller prohibits processing by the first replenishment controller.

6. The substrate processing apparatus of claim 1, wherein the second replenishment controller determines an amount to reduce the storage amount of the processing liquid in the tank based on a difference between the calculation value of the replenishment amount and the set value.

7. The substrate processing apparatus of claim 1, wherein, when the calculation value of the replenishment amount is the set value or more, the second replenishment controller executes neither the reducing the storage amount of the processing liquid in the tank by the discharge part nor the replenishing the processing liquid to the tank by the supply part.

8. The substrate processing apparatus of claim 1, wherein the discharge part includes at least one of:
a first discharge part including a first discharge line connected to the tank and a first opening/closing valve configured to open/close the first discharge line; and
a second discharge part including a second discharge line connected to the circulation line and a second opening/closing valve configured to open/close the second discharge line.

* * * * *